(12) United States Patent
Komuro

(10) Patent No.: US 6,424,220 B2
(45) Date of Patent: Jul. 23, 2002

(54) SINGLE-ENDED PUSH-PULL AMPLIFIER CIRCUIT

(75) Inventor: Yoshiyuki Komuro, Saitama (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 09/872,062

(22) Filed: Jun. 1, 2001

(30) Foreign Application Priority Data

Jun. 5, 2000 (JP) ........................................ 2000-168202

(51) Int. Cl.[7] .................................................. H03E 3/26
(52) U.S. Cl. ...................................... 330/267; 330/263
(58) Field of Search ................................ 330/262, 263, 330/267, 273

(56) References Cited

U.S. PATENT DOCUMENTS

| 4,384,261 A | * | 5/1983 | Yokoyama | ................... 330/267 |
| 4,814,723 A | * | 3/1989 | Botti | ........................... 330/263 |
| 5,337,012 A | * | 8/1994 | Dijkmans | .................... 330/267 |

FOREIGN PATENT DOCUMENTS

| JP | 55035520 A | 3/1980 |
| JP | 58-83407 | * 5/1983 ................... 330/263 |

* cited by examiner

*Primary Examiner*—Tuan T. Lam
(74) *Attorney, Agent, or Firm*—Woodcock Washburn LLP

(57) ABSTRACT

A first amplifying transistor is connected between a first supply terminal and an output terminal, the latter being grounded via a loudspeaker system, and another such transistor between a second supply terminal and the output terminal. A first and a second drive transistor are Darlington connected respectively to the first and the second amplifying transistor. A first biasing circuit is connected between the first supply terminal and the base of the first drive transistor, and a second biasing transistor between the second supply terminal and the base of the second drive transistor. In order for an idling current of stable magnitude to flow immediately when the amplifier circuit is powered on, without need for preadjustment of circuit elements, an improved third biasing circuit is connected between the bases of the two drive transistors. The third biasing circuit comprises two biasing transistors and a serial circuit of two resistors. One of the biasing transistors has its collector connected to the base, and its base to the emitter, of either of the two drive transistors, thereby forming a negative feedback circuit.

10 Claims, 11 Drawing Sheets

SINGLE-ENDED PUSH-PULL AMPLIFIER CIRCUIT

BACKGROUND OF THE INVENTION

This invention relates to amplifiers, to audio amplifiers, and particularly to a single-ended push-pull amplifier circuit suitable for use at the final stage of multistage audio amplifiers.

Complementary single-ended push-pull amplifiers (FIGS. 1 and 2) have been known and used extensively for the final-stage power amplification of audio signals. Japanese Unexamined Patent Publication No. 55-35520 suggests improvements relating to amplifier circuits of this broad category.

The typical push-pull amplifier of the kind under consideration has two amplifying transistors, one connected between a positive supply terminal and an output terminal, and the other between a negative supply terminal and the output terminal. The output terminal is grounded via a loudspeaker system. Two other transistors are employed for driving the amplifying transistors. The drive transistors have their base current controlled according to the incoming audio signal, thereby controlling current flow through the amplifying transistors. Thus is the loudspeaker system supplied with the current amplified according to the magnitude of the input signal.

For operation as a class A amplifier, the biasing circuits incorporated into the amplifier circuit are so preset that idling current flows through the transistors at all times, even when the signal input is zero. Unless kept under constant control, however, the idling current could cause the overheating and eventual breakdown of the transistors. The idling current should not be so great in magnitude as to lead to the transistor overheating but so low as to cause switching distortion, as in class B amplifiers.

Various suggestions have been made, and some put into practice, for precluding the thermal breakdown of the transistors. Some such known suggestions, bearing particular pertinence to the instant invention, are unsatisfactory by reason of too delicate preadjustment of some circuit elements that must be made at the cost of considerable time and labor to provide idling current of a desired level. Another objection is the prolonged period of time required by the prior art amplifiers of the type in question for the idling current to rise to the required level after the amplifier is switched on.

SUMMARY OF THE INVENTION

The present invention seeks to make totally unnecessary the time-consuming preadjustment conventionally needed by the class A amplifiers of the type defined to assure the flow of constant-level idling current in the face of temperature variations of the relevant circuit elements such as transistors.

The invention also seeks to provide for the stabilization of the idling current in the amplifier circuit just after it is switched on, virtually eliminating the warm-up period heretofore required for the idling current to gain its steady-state magnitude.

Briefly, the present invention may be summarized as a single-ended push-pull amplifier circuit suitable for power amplification of audio signals, among other applications. Included are first current control means (e.g. two transistors in Darlington connection) connected between a first supply terminal and an output terminal for controlling current flow therebetween, and second current control means (e.g. two other transistors in Darlington connection) connected between a second supply terminal and the output terminal for controlling current flow therebetween. A biasing circuit is provided according to the invention which comprises a serial connection of a first and a second resistor, the latter being connected to a control terminal of either of the first and the second current control means, and a first and a second bias transistor. The first bias transistor is connected between a control terminal of the other of the first and the second current control means and the first resistor, and has a control terminal connected to said other of the first and the second current control means. The second bias transistor is connected between the control terminals of the first and the second current control means and has a control terminal connected to a junction between the first and the second resistor.

Such being the improved construction of the amplifier circuit, particularly the biasing circuit, according to the invention, the current through the bias transistors increases in magnitude with the current through the current control means, resulting in negative feedback of the control voltages for the current control means. The current through the current control means is therefore stabilized without waiting for the warming of the bias transistors.

Another pronounced advantage of the improved biasing circuit is that the magnitude of the idling current becomes independent of temperatures merely as the two resistors connected in series with the first bias transistor are made equal in value. The resistors can be fixed at the same value. No readjustment whatever prior to shipment, and of course in use, is necessary for provision of an idling current of desired magnitude.

In an alternative embodiment of the invention a diode is connected in series with the resistors for additional temperature compensation. Various other embodiments will be disclosed to show various forms the amplifier circuit according to the invention can take in practice.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION

Figure 1:
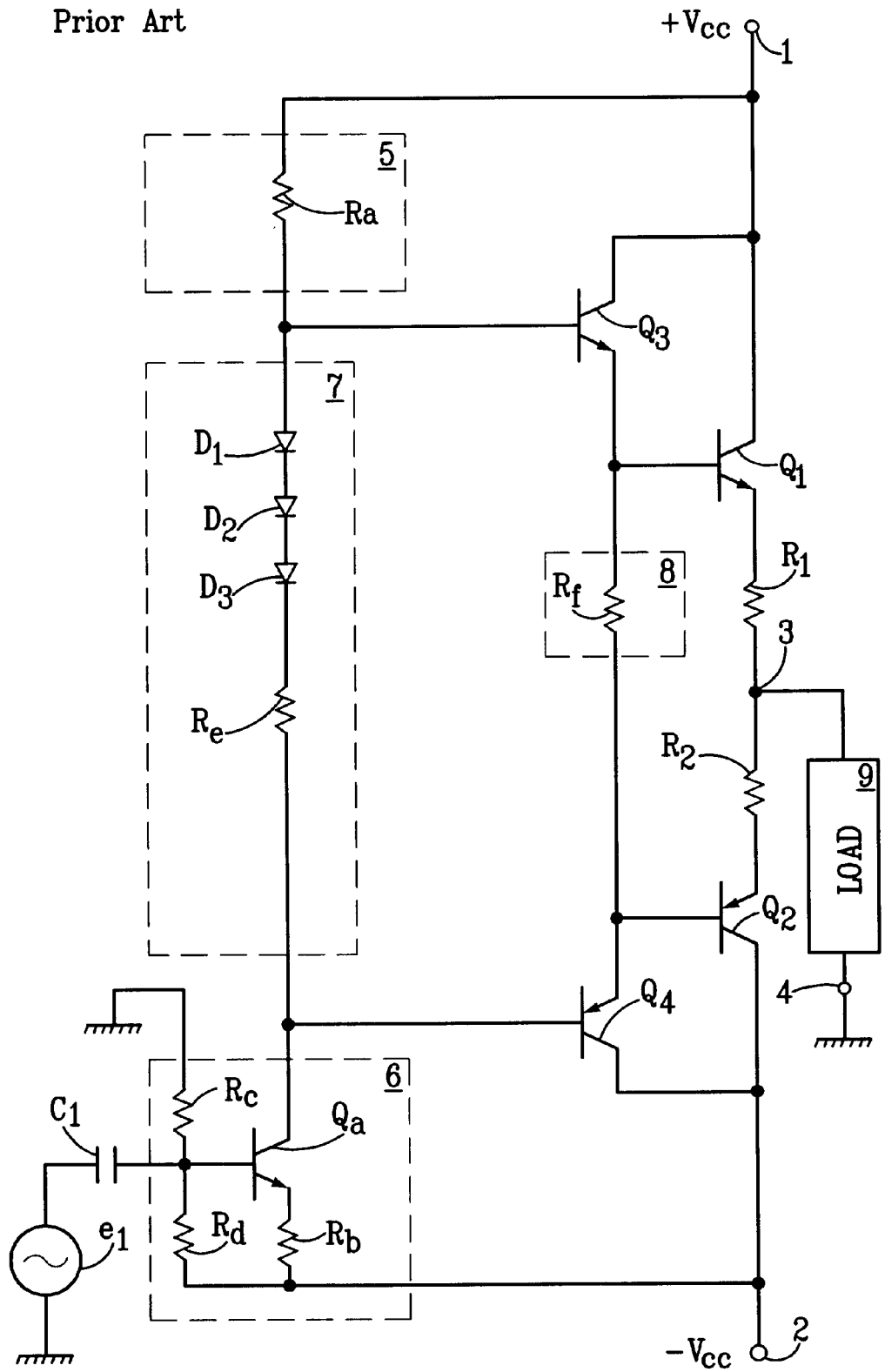
FIG. 1 is a schematic electrical diagram of a prior art single-ended push-pull amplifier circuit bearing particular pertinence to the instant invention.

It is considered essential that the prior art complementary single-ended push-pull amplifier circuit be shown and described in some more detail, the better to make clear the features and advantages of the instant invention. With reference to FIG. 1 the prior art amplifier circuit comprises a first supply terminal 1 for providing a positive supply voltage +Vcc, a second supply terminal 2 for providing a negative supply voltage −Vcc, an output terminal 3, a ground terminal 4, four final-stage amplifier elements shown as transistors $Q_1$, $Q_2$, $Q_3$ and $Q_4$, and four biasing circuits 5, 6, 7 and 8. A load 9 such as a loudspeaker system is connected between output terminal 3 and ground terminal 4. It is understood that the load 9 has no output transformer.

The first amplifier element $Q_1$, is a npn-transistor having a collector connected to the first supply terminal 1, and an emitter connected to the output terminal 3 via a resistor $R_1$. This resistor has a resistance value as low as, say, 0.3 ohm. The second amplifier element $Q_2$ is an pnp-transistor having a collector connected to the second supply terminal 2, and an emitter connected to the output terminal 3 via another resistor $R_2$. This second resistor has the same resistance value as that of the first resistor $R_2$.

The third transistor $Q_3$, an npn-transistor, is for driving the first transistor $Q_1$, having a collector connected to the collector of the first transistor, and an emitter connected to the base of the first transistor to provide a Darlington amplifier circuit. The fourth transistor $Q_4$ is of the pnp type for driving the second transistor $Q_2$, having a collector connected to that of the second transistor, and an emitter connected to the base of the second transistor to provide another Darlington amplifier circuit.

The first biasing circuit 5 has a resistor Ra connected between the first supply terminal 1 and the base of the third transistor $Q_3$.

The second biasing circuit 6, which might be termed a signal input circuit, comprises an npn-transistor $Q_a$ and three resistors $R_b$, $R_c$, and $R_d$. The transistor $Q_a$ has a collector connected to the base of the fourth transistor $Q_4$, and an emitter connected to the second supply terminal 2 via the resistor $R_b$. The resistor $R_c$ is connected between the ground and the base of the transistor $Q_a$. The resistor $R_d$ is connected between the base of the transistor $Q_a$ and the second supply terminal 2. The base of the transistor $Q_a$ is grounded via a coupling capacitor $C_1$ and a source $e_1$ of an input audio signal to be amplified.

The third biasing circuit 7 comprises a resistor $R_e$ and a serial circuit of three temperature-compensating diodes $D_1$, $D_2$ and $D_3$ connected in series therewith. The fourth biasing circuit 8 takes the form of a resistor $R_f$ connected between the bases of the first transistor $Q_1$ and second transistor $Q_2$.

As is well known, when supplied with the audio signal from its source $e_1$, the transistor $Q_a$ of the second biasing circuit 6 will change in impedance with the input current magnitude, thereby controlling the base currents of the driving transistors $Q_3$ and $Q_4$ and hence the currents through the amplifying transistors $Q_1$ and $Q_2$. Thus will the load 9 be supplied with a current that varies in power level with the input current. As the input current reverses in direction, the load 9 will be energized in two opposite directions, one through the path comprising the first supply terminal 1, first amplifying transistor $Q_1$, first resistor $R_1$, and load 9, and the other through the path comprising the ground terminal 4, load 9, second resistor $R_2$, second amplifying transistor $Q_2$, and second supply terminal 2.

The biasing circuits 5–7 are so made that so-called "idling current" flows through the transistors $Q_1$–$Q_4$ when the input audio signal is zero, that is, when no signal current is flowing through the load 9. This idling current is expressed as:

$$I_{id} = [V_{BB} - (V_{BE1} + V_{BE2} + V_{BE3} + V_{BE4})]/(R_1 + R_2)$$

where $I_{id}$=idling current $V_{BB}$=voltage across the third biasing circuit 7 when the input signal is zero $V_{BE1}$=base-emitter voltage of the first transistor $Q_1$.

$V_{BE2}$=base-emitter voltage of the first transistor $Q_2$ $V_{BE3}$=base-emitter voltage of the first transistor $Q_3$ $V_{BE4}$=base-emitter voltage of the first transistor $Q_4$.

Much less in magnitude than the peak value of the input signal, the idling current is known to be effective for reduction of the switching distortion that occurs in class B amplifiers when the voltage is approximately zero.

Let us assume that the bias voltage $V_{BB}$ due to the third biasing circuit 7 were constant regardless of temperatures. Since the transistors $Q_1$–$Q_4$ have a temperature coefficient of approximately −2 millivolt per degree in centigrade, the idling current $I_{id}$ would increase in magnitude with the temperature of these transistors. The greater idling current would in turn give rise to greater power loss due to the transistors $Q_1$–$Q_4$, elevating their temperatures. The result would be an even more rise in the idling current. The cycle might repeat itself indefinitely until the transistors broke down in the worst case.

The temperature-compensating diodes $D_1$–$D_3$ of the third biasing circuit 7 are designed to preclude the thermal breakdown of the transistors $Q_1$–$Q_4$. Thermally coupled to these transistors, the diodes $D_1$–$D_3$ have approximately the same temperature coefficient as that of the transistors. Consequently, with a rise in temperature, the bias voltage $V_{BB}$ will drop to prevent an increase in the idling current level. The biasing circuit 7 with the three temperature-compensating diodes $D_1$–$D_3$ is objectionable as it requires fine adjustment of the resistor $R_e$ for optimization of the bias voltage $V_{BB}$.

Figure 2:
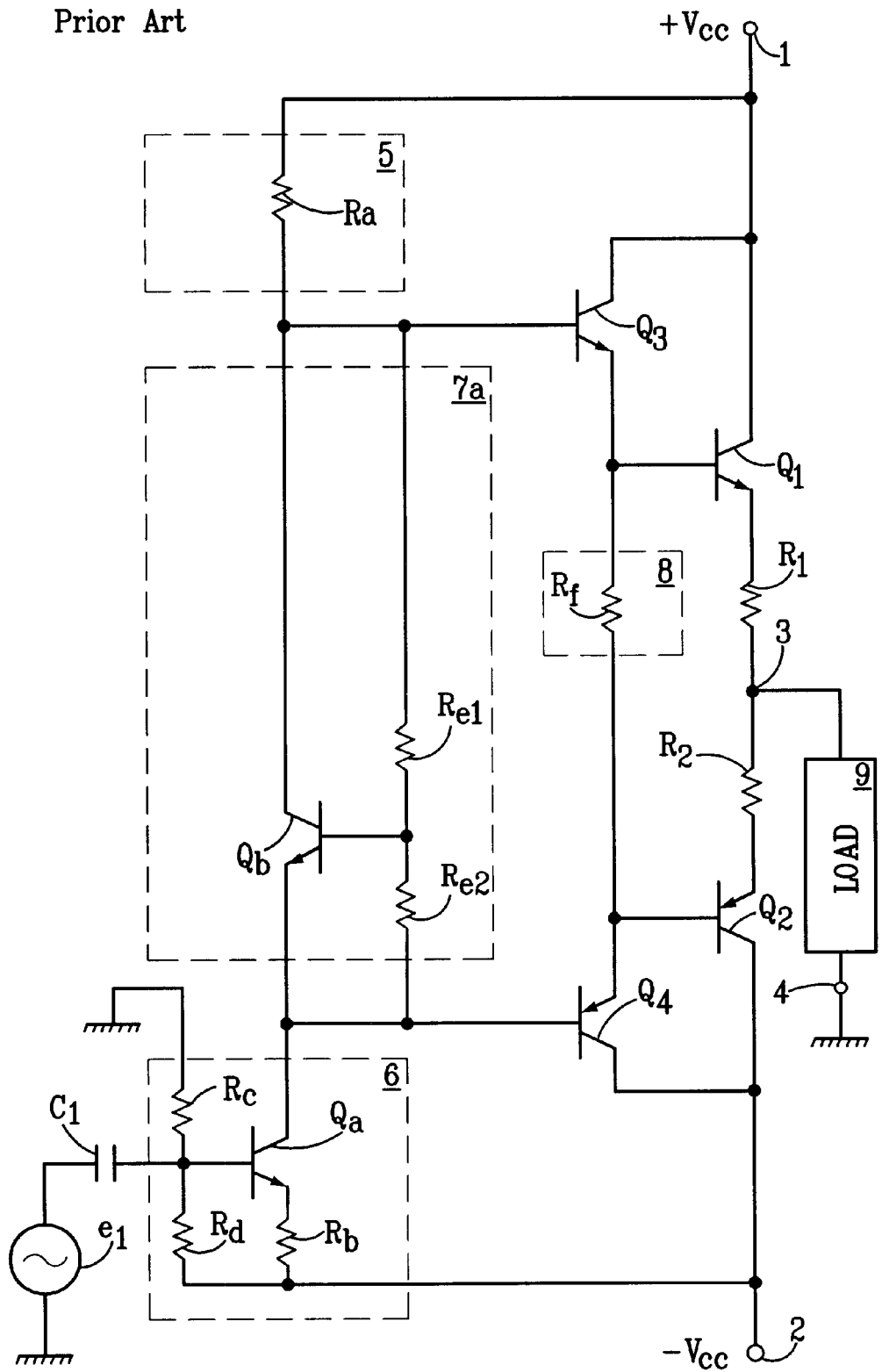
FIG. 2 is a schematic electrical diagram of another prior art push-pull amplifier circuit associated with the FIG. 1 amplifier circuit.

It may be contemplated to modify the third biasing circuit 7 into the circuit 7a shown in FIG. 2. The modified biasing circuit 7a has a transistor $Q_b$ and two resistors $R_{e1}$ and $R_{e2}$ connected between the bases of the transistors $Q_3$ and $Q_4$. Thermally coupled to the transistors $Q_1$–$Q_4$, the biasing transistor $Q_b$ has its collector-emitter resistance lowered with a rise in the temperatures of the transistors $Q_1$–$Q_4$. The bias voltage $V_{BB}$ due to the biasing circuit 7a will drop with the total resistance of the biasing circuit 7a, preventing an increase in idling current $I_{id}$.

The bias voltage due to the modified biasing circuit 7a can be expressed as:

$$V_{BB} = V_{BE1} + V_{BE2} + V_{BE3} + V_{BE4} + I_{id}(R_1 + R_2)$$

$$V_{BB}=V_{BEb}(R_{e1}+R_{e2})/R_{e2}$$

where $V_{BEb}$=base-emitter voltage of the transistor $Q_b$ $V_{BB}$=bias voltage across the modified biasing circuit 7a.

Since $V_{BE1}$, $V_{BE2}$, $V_{BE3}$, $V_{BE4}$ and $V_{BEb}$ are all approximately equal to one another, each of these may be redesignated $V_{BE}$. Then, from the foregoing equations:

$$I_{id}(R_1 + R_2) = [V_{BE}(R_{e1} + R_{e2})/R_{e2}] - 4V_{BE}$$
$$= V_{BE}(R_{e1} - 3R_{e2})/R_{e2}.$$

As is clear from the equation just above, the idling current $I_{id}$ can be reduced to zero by making the resistor $R_{e1}$ of the FIG. 2 biasing circuit 7a thrice as high in resistance value as the other resistor $R_{e2}$. Then the idling current will not augment in the face of the temperature rise of the transistors $Q_1$–$Q_4$, so that these transistors will be saved from destruction due to the heat cycle explained previously.

The solution of FIG. 2 is nevertheless unsatisfactory for several reasons. First, either of the resistors $R_{e1}$ and $R_{e2}$ must be semifixed for obtaining an idling current of required magnitude. For, should the values of these resistors be fixed at a ratio of one to three, no idling current would flow, a class B amplifier. It is well known that distortion due to switching occurs in class B amplifiers when the voltage is approximately zero. A constant flow of some idling current is mandatory for distortionless amplification.

Thus, in the case of the FIG. 2 circuit, the values of the resistors $R_{e1}$ and $R_{e2}$ must be critically determined in relation to each other so that the resulting idling current will cause neither switching distortion nor the thermal breakdown of the transistors. Such critical adjustment of the resistors $R_{e1}$ and $R_{e2}$ led to higher manufacturing costs because of longer periods of time required for that purpose.

A further objection to the FIG. 2 amplifier circuit is an inconveniently prolonged length of time required for the idling current to gain a steady-state level following the closure of the power switch. Because of the criticality of the idling current magnitude pointed out above, the resistors $R_{e1}$ and $R_{e2}$ were so preadjusted that the steady-state level was obtained after the transistors were heated to an appropriate temperature.

The problems so far discussed in connection with the prior art are by no means specific to the amplifier circuits of FIGS. 1 and 2. Similar problems arose in amplifier circuits that were connected to the signal sources in different ways, that had different types of push-pull transistors, that had different power supply circuits, or that were of emitter-follower, rather than push-pull, construction.

The amplifier circuit according to the invention defeats all such shortcomings of the prior art, as will become better understood from the following detailed description of some preferred forms.

Figure 3:
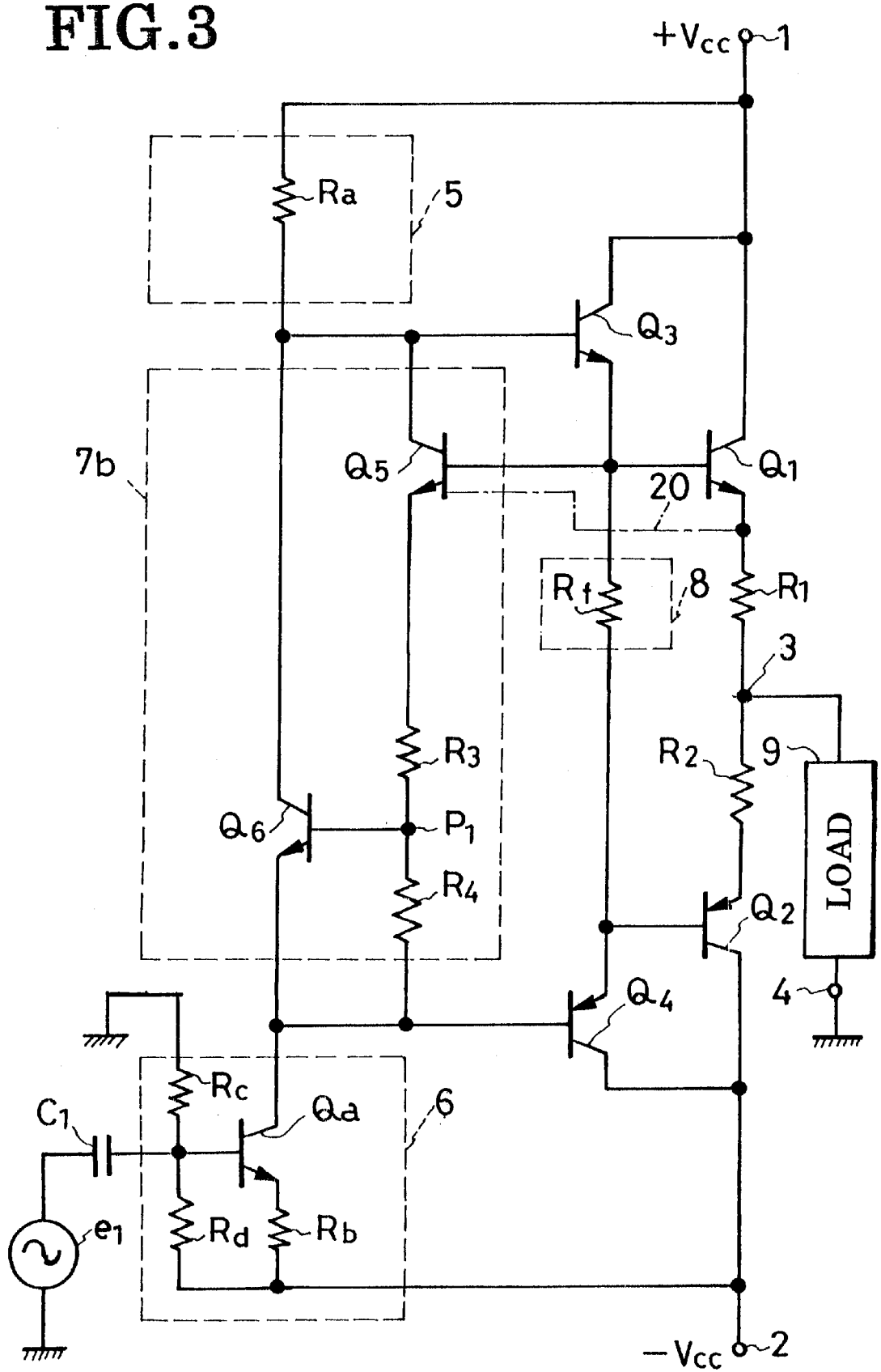
FIG. 3 is a schematic electrical diagram of a preferred form of single-ended push-pull amplifier circuit according to the invention.

Embodiment of FIG. 3

In FIG. 3 is shown the present invention as embodied in an audio power amplifier circuit. The representative power amplifier circuit according to the invention features an improved third biasing circuit 7b in substitution for its FIG. 1 counterpart 7 or FIG. 2 counterpart 7a. The representative amplifier circuit is akin in the other details of construction to the prior art amplifier circuits of FIGS. 1 and 2, so that like reference characters are used to denote like parts in FIGS. 1–3, as well as in all the other figures to be referred to subsequently.

The two transistors $Q_1$ and $Q_2$ of the representative power amplifier circuit according to the invention may be more broadly envisaged as current control elements, controlling current flow from the supply terminals 1 and 2 to the loudspeaker system 9. Each the first and the second transistors $Q_1$ and $Q_2$ has a collector as a first main terminal, an emitter as a second main terminal, and a base as a control terminal. The other two transistors $Q_3$ and $Q_4$ are Darlington-connected to the transistors $Q_1$ and $Q_2$, respectively, for driving them. The two Darlington-connected transistors $Q_1$ and $Q_3$ constitute in combination a first current control or amplifier means. Essentially, this first control means is equivalent to one npn-transistor, controlling current flow from collector to emitter of the current control transistor $Q_1$ under the control of a signal applied to the base of the drive transistor $Q_3$.

Similarly, the other two Darlington-connected transistors $Q_2$ and $Q_4$ constitute in combination a second current control or amplifier means essentially equivalent to one pnp-transistor. The second current control means controls current flow from collector to emitter of the current control transistor $Q_2$ under the control of a signal applied to the base of the drive transistor $Q_4$.

Constituting a feature of this invention, the third biasing circuit 7b comprises two additional transistors $Q_5$ and $Q_6$, hereinafter referred to as bias transistors, and two resistors $R_3$ and $R_4$, hereinafter referred to as bias resistors. It is understood that the bias transistors $Q_5$ and $Q_6$ are both thermally coupled to all or some of the current control transistors $Q_1$–$Q_4$ by means of a heat sink, not shown, of conventional make. In any event it is recommended that the bias transistors $Q_5$ and $Q_6$ be thermally coupled to at least either of the amplifying transistors $Q_1$ and $Q_2$.

The first bias transistor $Q_5$ has its collector connected to the base of the first drive transistor $Q_3$, and its base to the emitter of the first drive transistor. The first bias resistor $R_3$ has one extremity thereof connected to the emitter of the first bias transistor $Q_5$, and the other extremity to one extremity of the second bias resistor $R_4$. The other extremity of this second bias resistor $R_4$ is connected to the base of the second drive transistor $Q_4$. The second bias transistor $Q_6$ has its collector connected to the base of the first drive transistor $Q_3$, its emitter to the base of the second drive transistor $Q_4$, and its base to the junction $P_1$ between the bias resistors $R_3$ and $R_4$.

All but the third biasing circuit 7b of the FIG. 3 amplifier circuit according to the invention is constructed as previously set forth in connection with the prior art circuits of FIGS. 1 and 2.

In the practice of the invention the voltages +VCC and −VCC of the supply terminals 1 and 2 may be set at +9.4 and −9.4 volts; the resistors $R_1$ and $R_2$ both at 0.22 ohm; the impedance of the speaker system 9 at 4–8 ohms; the resistors $R_3$ and $R_4$ both at 1.8 kilohms; and the resistor $R_f$ of the fourth biasing circuit 8 at 330 ohms. Preferably, the drive transistors $Q_3$ and $Q_4$ should have a transition frequency $f_T$ higher than that of the amplifying transistors $Q_1$ and $Q_2$.

Operation of the FIG. 3 Embodiment

The transistor $Q_a$ of the second biasing circuit 6 will change in impedance with the alternating input signal from its source $e_1$ causing current flow through the transistors $Q_2$ and $Q_4$ during the positive half-waves of the input signal and through the transistors $Q_1$ and $Q_3$ during the negative half-waves of the input signal. Current will flow in one direction through the path comprising the ground terminal 4, load 9, second resistor $R_2$, second amplifying transistor $Q_2$, and second supply terminal 2, and in the other direction through the path comprising the first supply terminal 1, first amplifying transistor $Q_1$, first resistor $R_1$, load 9, and ground terminal 4.

The third biasing circuit 7b functions to cause the flow of idling current of required magnitude right after the circuit is turned on, without causing the thermal breakdown of the transistors $Q_1$–$Q_4$. Base current will flow to the first drive transistor $Q_3$ via the resistor $R_a$ of the first biasing circuit 5 upon energization of the supply terminals 1 and 2. The equivalent resistance of the third biasing circuit 7b is infinitely great immediately after the circuit is powered on, because then both transistors $Q_5$ and $Q_6$ are off. Consequently, the bias voltages impressed between the base and emitter of the drive transistors $Q_3$ and $Q_4$ depend upon the resistances of the first, second and fourth biasing circuits 5, 6 and 8.

Also, because of the noted high resistance of the third biasing circuit 7b just after the circuit is switched on, the base potential of the first drive transistor $Q_3$ will be high, and that of the second drive transistor $Q_4$ low, resulting in the flow of relatively great base current to the these transistors $Q_3$ and $Q_4$. Base current will also flow to the amplifying transistors $Q_1$ and $Q_2$ via the drive transistors $Q_3$ and $Q_4$. These drive transistors $Q_3$ and $Q_4$ will then function as bias resistors, so to say, for the amplifying transistors $Q_1$ and $Q_2$.

At the same time, base current will be supplied to the transistor $Q_5$ of the third biasing circuit 7b via the first drive transistor $Q_3$. Thereupon the collector-emitter resistance of the bias transistor $Q_5$ will drop rapidly, resulting in a rise in the potential at the junction $P_1$ between the resistors $R_3$ and $R_4$. Then, with the flow of base current to the other bias transistor $Q_6$, its collector-emitter resistance will also drop. Thus will the resistance of the complete third biasing circuit 7b decrease.

A drop in the resistance of the third biasing circuit 7b is tantamount to a drop in the resistance between the bases of the two drive transistors $Q_3$ and $Q_4$. The base potential of the first drive transistor $Q_3$ will therefore drop, causing a decrease in the base current of the first drive transistor $Q_3$ and in the base current and collector current of the first amplifying transistor $Q_1$ The base potential of the second drive transistor $Q_4$ will rise, on the other hand, with a consequent drop in the base current and collector current of the transistors $Q_2$ and $Q_4$.

Thus the third biasing circuit 7b functions to cause negative feed-back of the collector current of the drive transistors $Q_3$ and $Q_4$. As a result, as the current flowing through the current control transistors $Q_1$–$Q_4$ tends to increase in magnitude with a rise in their temperature, the resistance of the third biasing circuit 7b will drop before the accompanying temperature rise of the bias transistors $Q_5$ and $Q_6$, which are thermally coupled as aforesaid to the current control transistors $Q_1$–$Q_4$. The drop in the resistance of the third biasing circuit 7b will result in the limitation of the current flow through the current control transistors $Q_1$–$Q_4$. That is to say that the idling current flowing through the current control transistors will stabilize instantly upon powering of the amplifier circuit.

Possibly, in the practice of the instant invention, the current control transistors $Q_1$–$Q_4$ may rise in temperature due to fluctuations in the performance characteristics of the circuit elements. Even then the current flowing through the current control transistors will be limited by the negative feedback action of the third biasing circuit 7b, so that the transistors will not heat up to such temperatures as to result in their breakdown.

The bias voltage across the third biasing circuit 7b of the FIG. 3 amplifier circuit is defined as:

$$V_{BB}=V_{BE1}+V_{BE2}+V_{BE3}+V_{BE4}+I_{id}(R_1+R_2)$$

$$V_{BB}=V_{BE3}+V_{VE5}+R_3(V_{BE6}/R_4)+V_{BE6}$$

where $V_{BB}$=bias voltage across the third biasing circuit 7b $V_{BE5}$=base-emitter voltage of the first bias transistor $Q_5$ $V_{BE6}$=base-emitter voltage of the second bias transistor $Q_6$.

The idling current of the FIG. 3 amplifier circuit is defined as:

$$I_{id}=[V_{BE5}+R_3(V_{BE6}/R_4)+V_{BE6}-(V_{BE1}+V_{BE2}+V_{BE4})]/(R_1+R_2).$$

Since $V_{BE1}$, $V_{BE2}$, $V_{BE3}$, $V_{BE4}$, $V_{BE5}$ and $V_{BE6}$ are all approximately equal to one another, let each of these be designated $V_{BE}$. Then the idling current of the FIG. 3 amplifier circuit can be rewritten as:

$$I_{id} = [R_3(V_{BE}/R_4) - V_{BE}]/(R_1 + R_2)$$

$$= V_{BE}(R_3 - R_4)/[(R_1 + R_2)R_5].$$

If the temperature coefficient of the transistors $Q_1$–$Q_6$ is −2 millivolt per degree in centigrade, the temperature coefficient $\Delta I_{id}/\Delta T$ of the idling current $I_{id}$ is defined as:

$$\Delta I_{id}/\Delta T=\{(R_3-R_4)/[(R_1+R_2)R_4]\}\times(-2\ mV/C).$$

As is apparent from the equation just above, the idling current $I_{id}$ of the FIG. 3 amplifier circuit becomes independent of temperatures if $R_3=R_4$, that is, if the two resistors $R_3$ and $R_4$ of the third biasing circuit 7b are equal in resistance value. It is thus seen that, thanks to the novel concepts of this invention, the idling current of proper magnitude can be preset by use of the fixed resistors only and without any adjustment whatever, affording a substantive saving in the manufacturing costs of the class A amplifiers of this kind.

It has been stated that the bias transistors $Q_5$ and $Q_6$ are thermally coupled to at least either of the amplifying transistors $Q_1$ and $Q_2$. Therefore, as the current flowing through the amplifying transistors $Q_1$ and $Q_2$ tends to increase due to a temperature rise, so will the current flowing through the bias transistors $Q_5$ and $Q_6$ thereby restricting the increase of the current flowing through the amplifying transistors. This thermal coupling of the bias transistors $Q_5$ and $Q_6$ to either or both of the amplifying transistors $Q_1$ and $Q_2$ serves to preclude the thermal breakdown of the amplifying transistors even in the case where the resistors $R_3$ and $R_4$ are not exactly set equal to each other in value. In short the amplifying transistors $Q_1$ and $Q_2$ is positively saved from thermal breakdown both by the negative feedback action of the third biasing circuit 7b and by the temperature-compensating action of the bias transistors $Q_5$ and $Q_6$.

Figure 4:
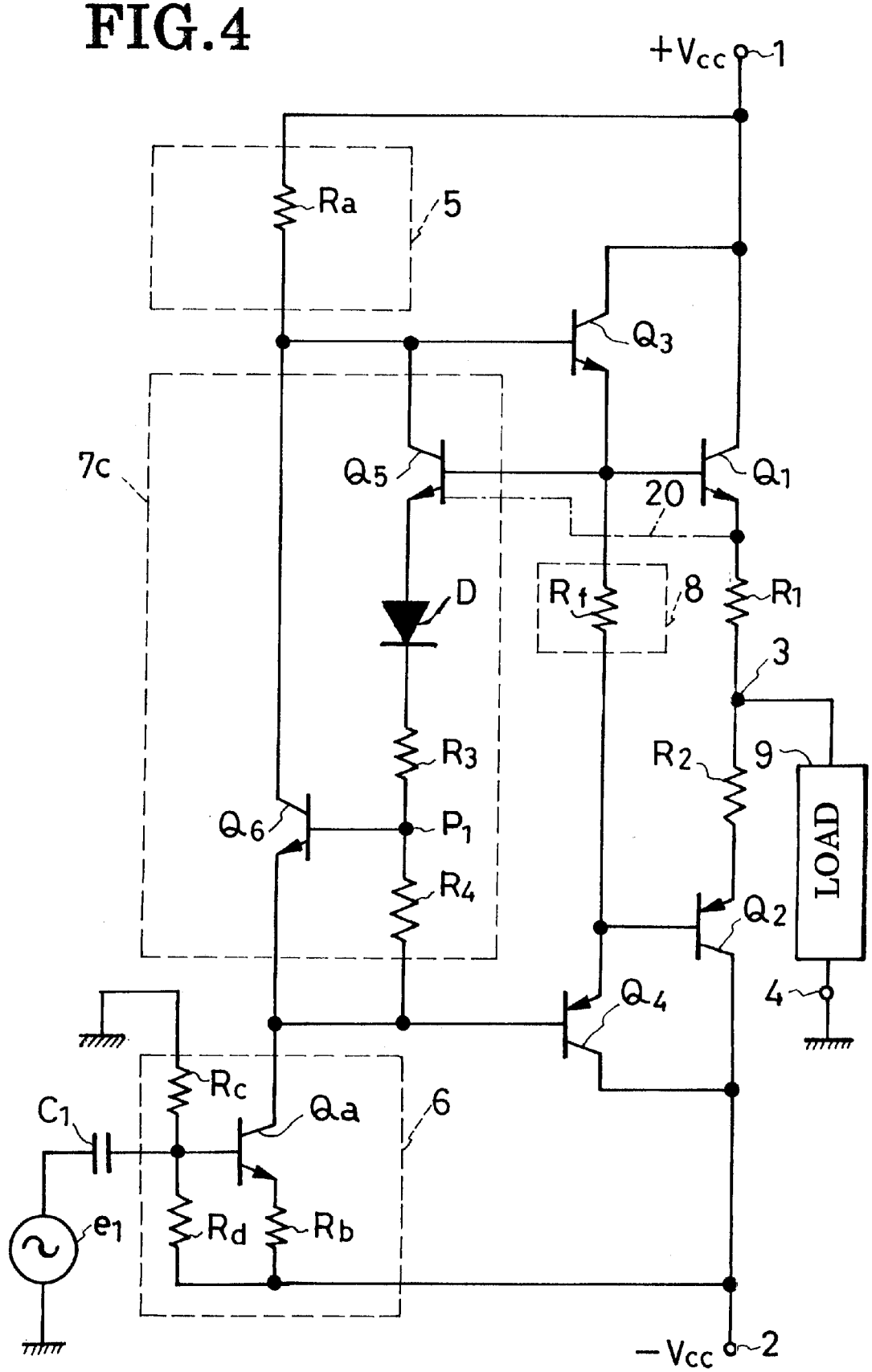
FIG. 4 is a schematic electrical diagram of another preferred form of single-ended push-pull amplifier circuit according to the invention.

Embodiment of FIG. 4

The third biasing circuit 7c shown in FIG. 4 differs from its FIG. 3 counterpart 7b in additionally having a diode D connected between the first bias transistor $Q_5$ and the first bias resistor $R_3$. It is understood that like the bias transistors $Q_5$ and $Q_6$, the diode D is thermally coupled to at least either of the four current control transistors $Q_1$–$Q_4$ and has approximately the same temperature coefficient therewith. The FIG. 4 amplifier circuit is similar to that of FIG. 3 in all the other details of construction.

Thus, also like the bias transistors $Q_5$ and $Q_6$, the diode D functions for temperature compensation of the current control transistors $Q_1$–$Q_6$, making the third biasing circuit 7c even more effective to prevent the thermal breakdown of the current control transistors.

Figure 5:
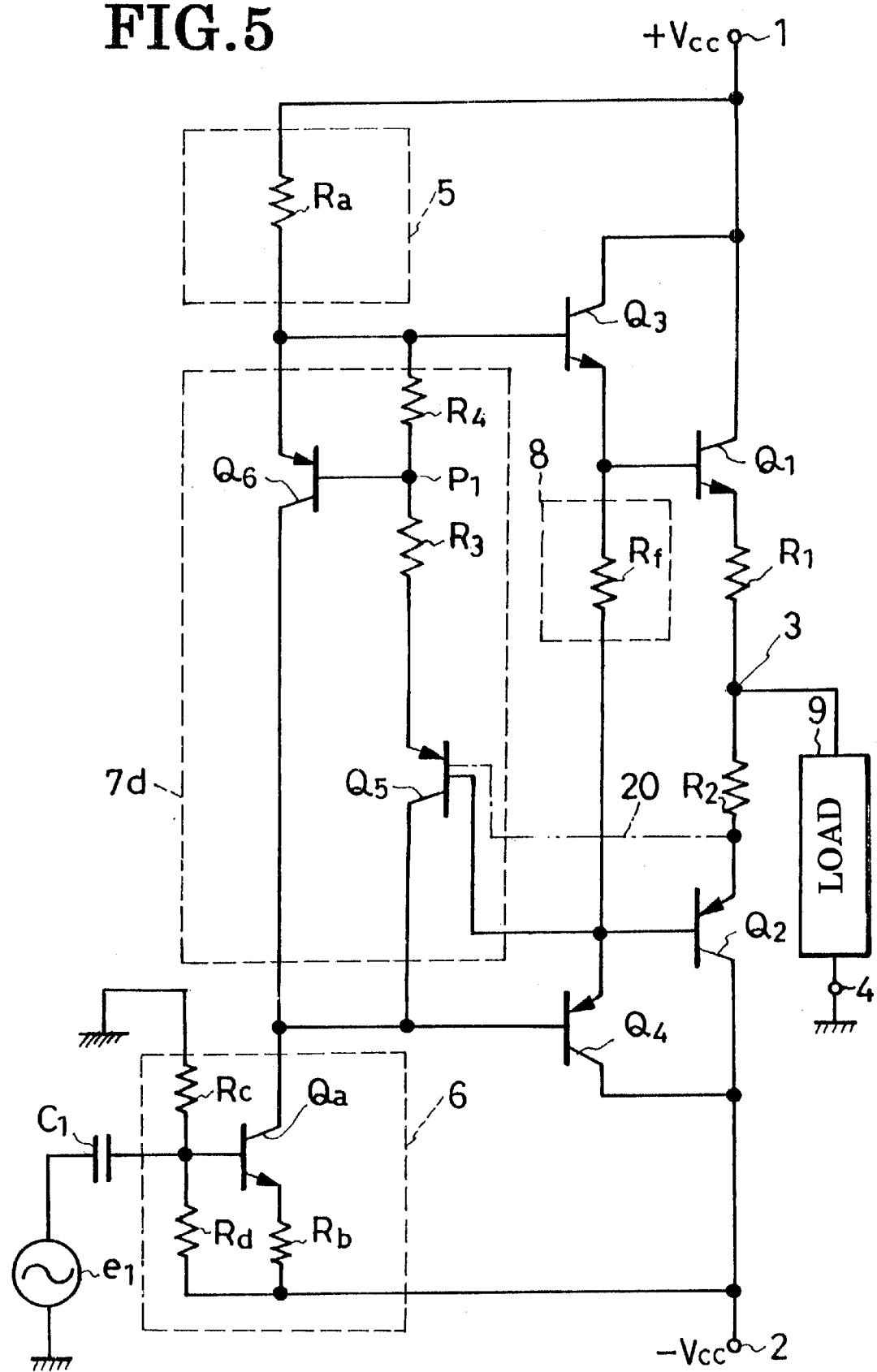
FIG. 5 is a schematic electrical diagram of yet another preferred form of single-ended push-pull amplifier circuit according to the invention.

Embodiment of FIG. 5

The power amplifier circuit of FIG. 5 features another modified third biasing circuit 7d and is identical with the FIG. 3 power amplifier circuit in all the other details of construction. The FIG. 5 third biasing circuit 7d comprises two resistors $R_3$ and $R_4$ and two pnp-transistors $Q_5$ and $Q_6$. The first bias transistor $Q_5$ has its collector connected to the base of the second drive transistor $Q_4$, and its base to the emitter of the second drive transistor. The first bias resistor $R_3$ has one extremity thereof connected to the emitter of the first bias transistor $Q_5$, and the other extremity to one extremity of the second bias resistor $R_4$. The other extremity of this second bias resistor $R_4$ is connected to the base of the first drive transistor $Q_3$. The second bias transistor $Q_6$ has its emitter connected to the base of the first drive transistor $Q_3$, its collector to the base of the second drive transistor $Q_4$, and its base to the junction $P_1$ between the bias resistors $R_3$ and $R_4$.

The FIG. 5 third biasing circuit 7d is essentially similar in operation to its FIG. 3 counterpart 7b. Namely, upon decrease in the resistance of the second drive transistor $Q_4$ with an increase in current flowing through the current control transistors $Q_{1-4}$, the current through the first bias transistor $Q_5$ will increase, and so will the current through the second bias transistor $Q_6$. As the resistance of the third biasing circuit 7d decreases, so will the current through the four current control transistors $Q_1$–$Q_4$. These transistors will be thus saved from thermal breakdown.

Figure 6:
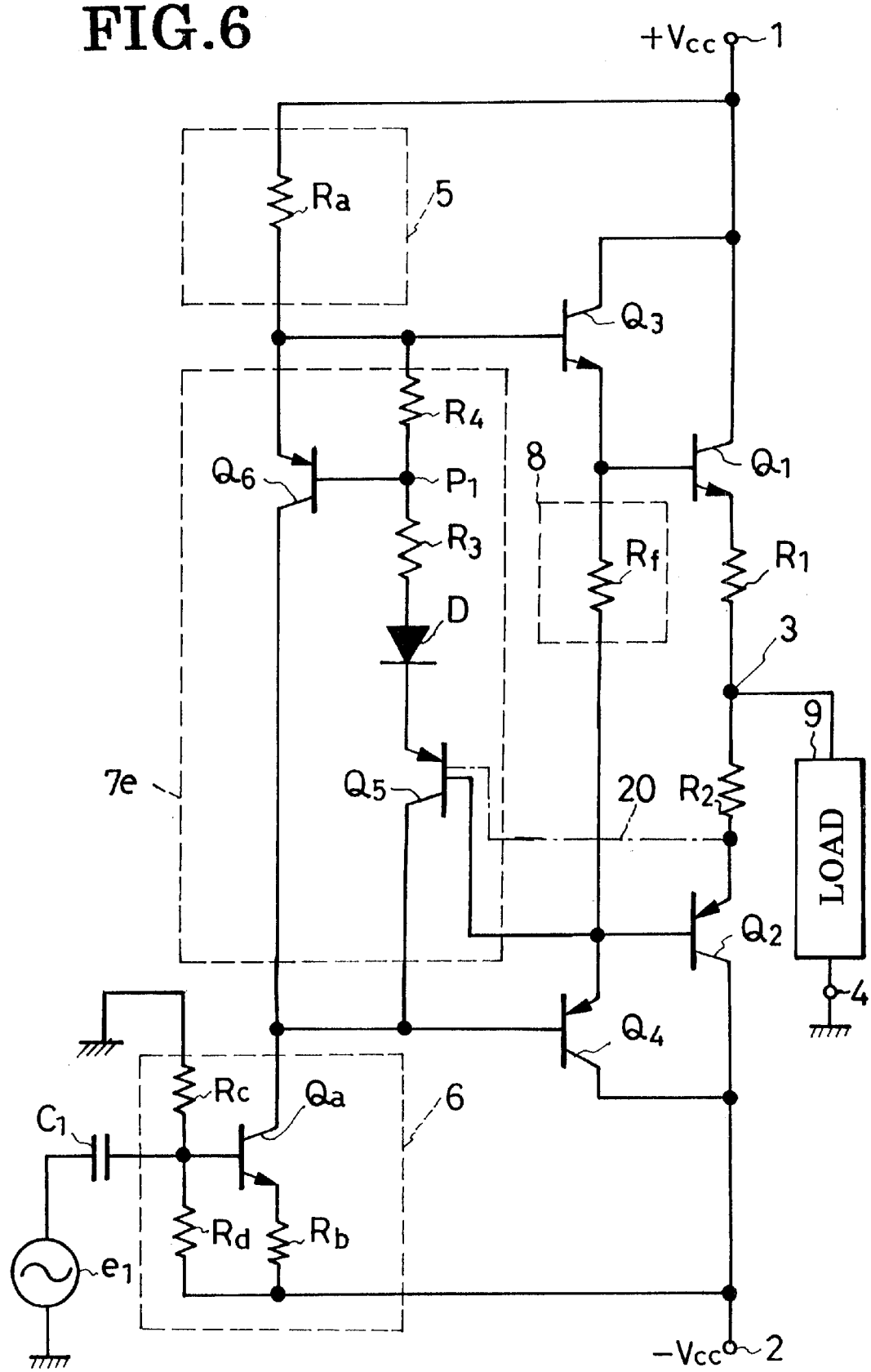
FIG. 6 is a schematic electrical diagram of still another preferred form of single-ended push-pull amplifier circuit according to the invention.

Embodiment of FIG. 6

The third biasing circuit 7e shown in FIG. 6 has a diode D in addition to all the components of the FIG. 5 third biasing circuit 7d. Connected between the first bias transistor $Q_5$ and the first bias resistor $R_3$, the diode D is thermally coupled to at least either of the four current control transistors $Q_1$–$Q_4$ and has approximately the same temperature coefficient therewith. The FIG. 6 amplifier circuit is similar to that of FIG. 3 in all the other details of construction.

Thus, just like FIG. 4 diode, the diode D functions for temperature compensation of the current control transistors $Q_1$–$Q_4$, making the third biasing circuit 7e even more effective than the FIG. 5 circuit 7d to prevent the thermal breakdown of the current control transistors.

Figure 7:
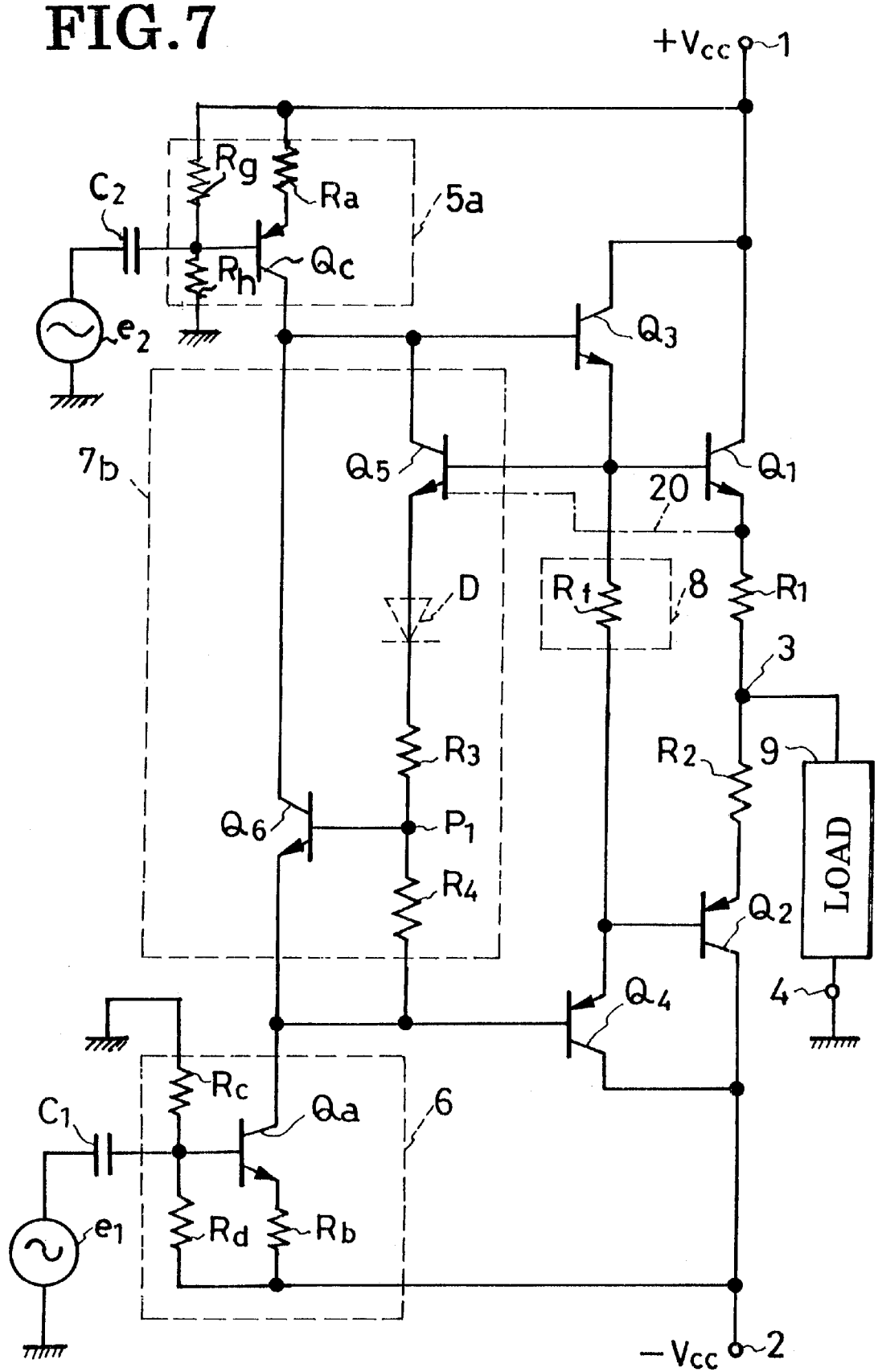
FIG. 7 is a schematic electrical diagram of yet another preferred form of single-ended push-pull amplifier circuit according to the invention.

Embodiment of FIG. 7

The FIG. 7 power amplifier circuit differs from the FIG. 3 embodiment in having a second signal source $e_2$, in addition to the first $e_1$, which is connected to a first biasing circuit 5a of correspondingly modified construction via a coupling capacitor $C_2$. The FIG. 7 amplifier circuit is akin to that of FIG. 3 in all the other details of construction.

The modified first biasing circuit 5a has one pnp-transistor $Q_c$ and three resistors $R_a$, $R_g$ and $R_h$. The bias transistor $Q_c$ has its emitter connected to the first supply terminal 1 via the resistor $R_a$, and its collector to the base of the first drive transistor $Q_3$. The resistor $R_g$ is connected between the first supply terminal 1 and the base of the bias transistor $Q_c$. The resistor $R_h$ is connected between the base of the bias transistor $Q_c$ and the ground. For supplying an audio signal in phase with that from the first signal source $e_1$, the second signal source $e_2$ is connected to the base of the bias transistor $Q_c$ via the second coupling capacitor $C_2$.

The biasing circuits 5a and 6 will operate opposite to each other, causing current flow through the amplifying transistors $Q_1$ and $Q_2$ according to the input signals from their sources $e_1$ and $e_2$. Identical with the FIG. 3 embodiment in all the other details of construction and operation, the FIG. 7 power amplifier circuit gains the same advantages therewith.

Figure 8:
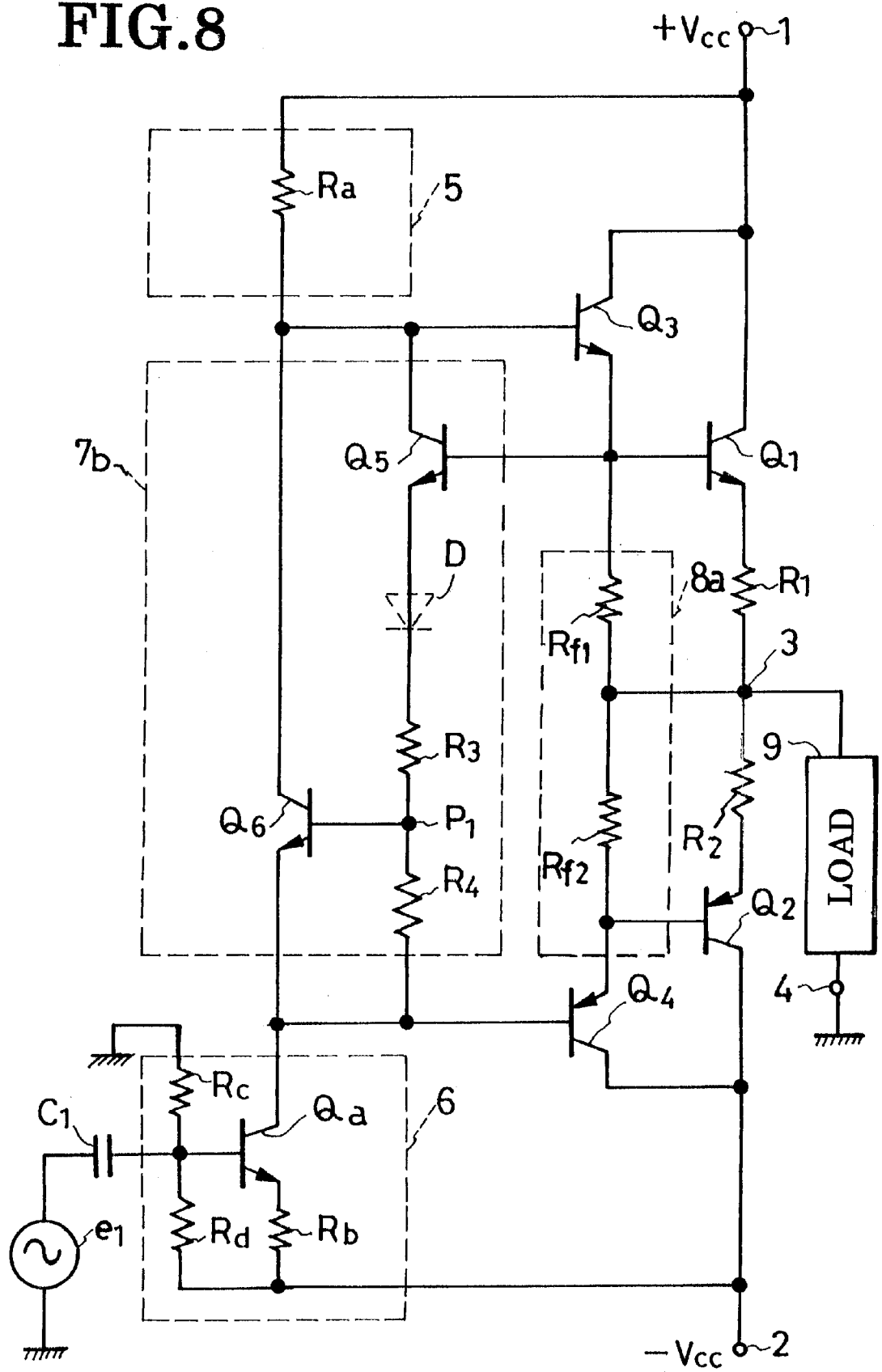
FIG. 8 is a schematic electrical diagram of a further preferred form of single-ended push-pull amplifier circuit according to the invention.

Embodiment of FIG. 8

The FIG. 8 embodiment features a fourth biasing circuit 8a different from its FIG. 3 counterpart 8. The fourth biasing circuit 8a has two resistors $R_{f1}$ and $R_{f2}$. The resistor $R_{f1}$ is connected between the base of the first amplifying transistor $Q_1$ and the output terminal 3. The other resistor $R_{f2}$ is connected between the output terminal 3 and the base of the second amplifying transistor $Q_2$. The FIG. 8 embodiment is similar to that of FIG. 3 in all the other details of construction and, therefore, in operation as well.

Figure 9:
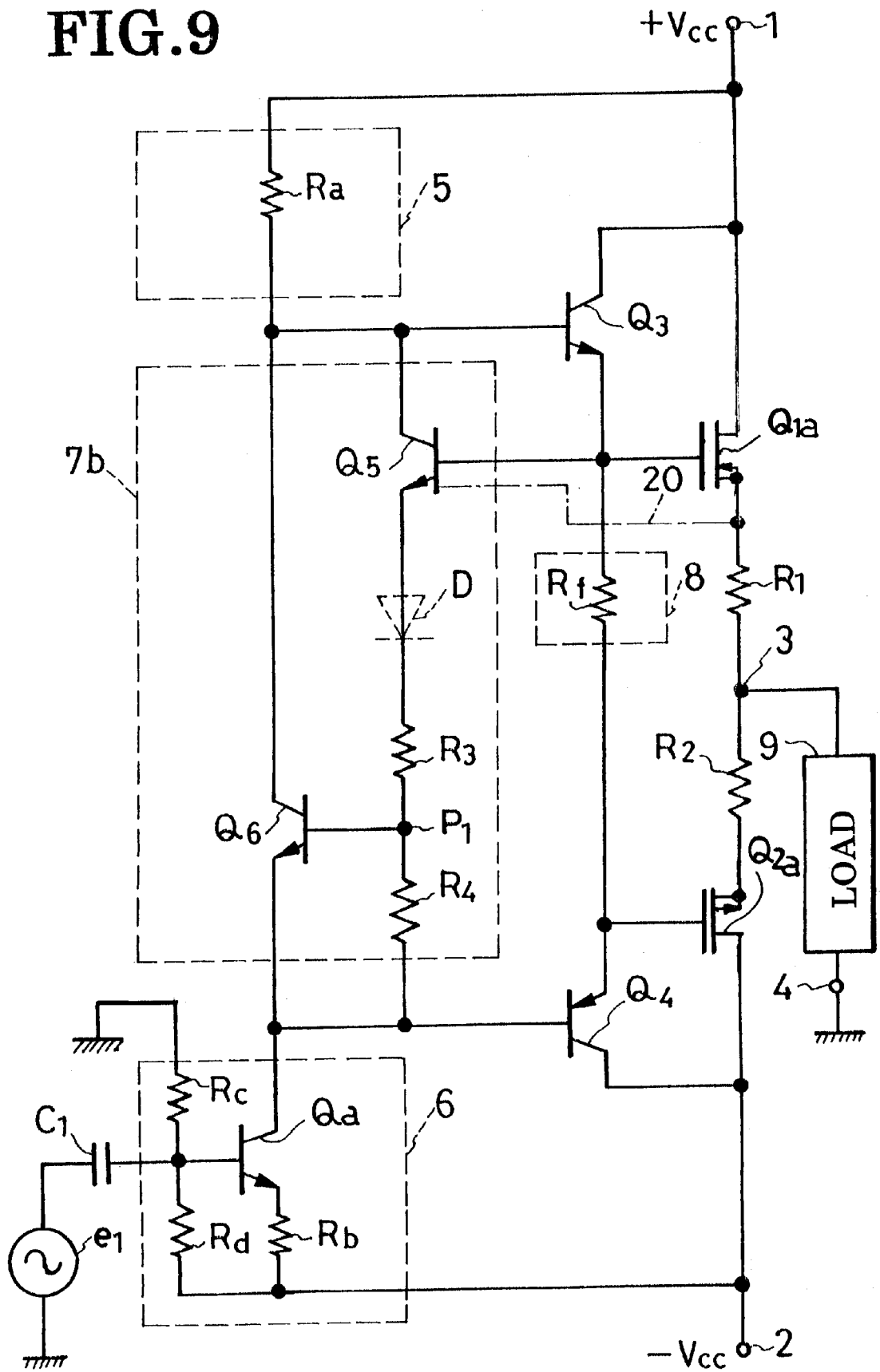
FIG. 9 is a schematic electrical diagram of a still further preferred form of single-ended push-pull amplifier circuit according to the invention.

Embodiment of FIG. 9

The power amplifier circuit of FIG. 9 differs from that of FIG. 3 only in that the amplifying transistors $Q_1$ and $Q_2$ of npn and pnp types in the latter are replaced by field-effect transistors $Q_{1a}$ and $Q_{1b}$ of n and p types in the former. The first amplifying field-effect transistor $Q_{1a}$ has its drain connected to the first supply terminal 1, its source to the first resistor $R_1$, and its gate to the emitter of the first drive transistor $Q_3$. The second amplifying field-effect transistor $Q_{1b}$ has its drain connected to the second supply terminal 2, its source to the second resistor $R_2$, and its gate to the emitter of the second drive transistor $Q_4$.

Like the FIG. 3 transistors $Q_1$ and $Q_2$, the field-effect transistors $Q_{1a}$ and $Q_{1b}$ are controlled by the drive transistors $Q_3$ and $Q_4$, respectively; that is, the resistance values of the field-effect transistors depend upon those of the drive transistors. The FIG. 9 amplifier circuit therefore operates in the same manner as does the FIG. 3 circuit and gains the same advantages therewith.

Figure 10:
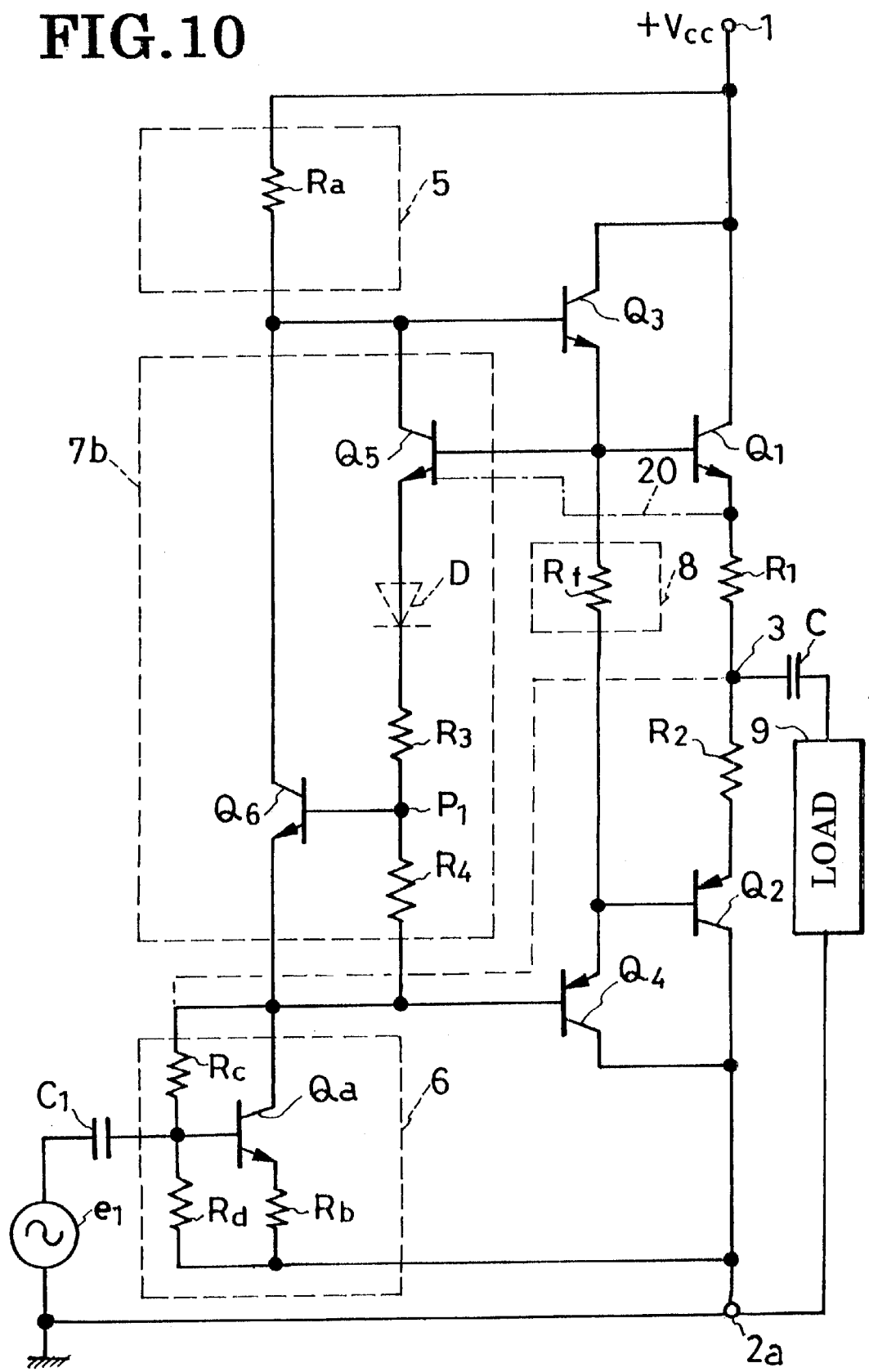
FIG. 10 is a schematic electrical diagram of a yet further preferred form of single-ended push-pull amplifier circuit according to the invention.

Embodiment of FIG. 10

FIG. 10 shows an adaptation of this invention to a unitary-power-supply construction, with the second supply terminal 2a grounded, and with a capacitor C connected between the output terminal 3 and the load 9. Even though the second supply terminal 2a is grounded, alternating current can be supplied to the load 9 as in all the foregoing embodiments thanks to the provision of the capacitor C, so that this embodiment gains the same advantages as does that of FIG. 3.

Incidentally, the illustrated connection of the resistor $R_c$ between the collector and base of the transistor $Q_a$ of the second biasing circuit 6 is not essential; instead, it could be connected between the output terminal 3 and the base of the transistor $Q_a$.

Figure 11:
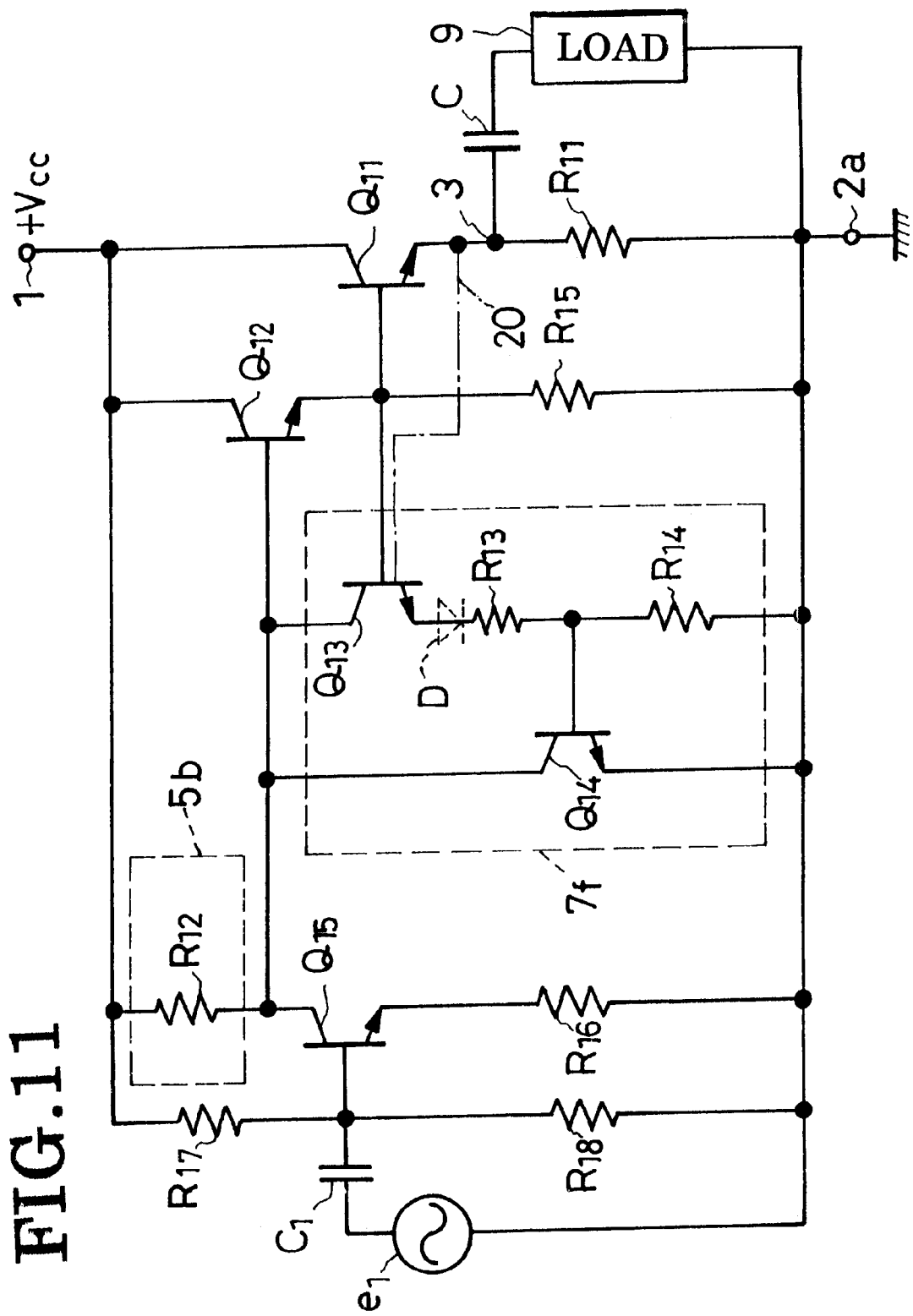
FIG. 11 is a schematic electrical diagram of an emitter-follower amplifier circuit to which are also applicable the concepts of the invention.

Embodiment of FIG. 11

In FIG. 11 is shown the invention as adapted for an emitter follower amplifier circuit. This embodiment employs but one current control or amplifying element in the form of an npn-transistor $Q_{11}$, which has its collector connected to the first supply terminal 1, and its emitter to the grounded second supply terminal 2a via the output terminal 3 and a first resistor $R_{11}$. The load 9 is connected in parallel with the first resistor $R_{11}$ via a capacitor C.

For driving the amplifying transistor $Q_{11}$ there is provided another npn-transistor $Q_{12}$ which has its collector connected to the first supply terminal 1, and its emitter to the base of the current control transistor. Thus, like the transistors $Q_1$ and $Q_3$ of the FIG. 3 amplifier circuit, the transistors $Q_{11}$ and $Q_{12}$ are Darlington connected, constituting a current control means or, equivalently, a single npn-transistor.

Constituting a first biasing circuit 5b, a resistor $R_{12}$ is connected between the first supply terminal 1 and the base of the drive transistor $Q_{12}$. A second biasing circuit 7f comprises two transistors $Q_{13}$ and $Q_{14}$ and two resistors $R_{13}$ and $R_{14}$. Their connections are the same as those of their counterparts in the FIG. 3 third biasing circuit 7b, except that the resistor $R_{14}$ and transistor $Q_{14}$ are both connected to the grounded second supply terminal 2a.

A further resistor $R_{15}$ is connected between the base of the amplifying transistor $Q_{11}$ and the grounded second supply terminal 2a. A further npn-transistor $Q_{15}$ has its collector connected to the base of the drive transistor $Q_{12}$, and its emitter to the grounded supply terminal 2a via a resistor $R_{16}$. A resistor $R_{17}$ is connected between the first supply terminal 1 and the base of the transistor $Q_{15}$, and a resistor $R_{18}$ between the base of the transistor $Q_{15}$ and the grounded supply terminal 2a. The signal source $e_1$ is connected to the base of the transistor $Q_{15}$ via the coupling capacitor $C_1$.

The transistors $Q_{11}$, $Q_{12}$, $Q_{13}$, $Q_{14}$ and $Q_{15}$ of the FIG. 11 embodiment are equivalent in function to the transistors $Q_1$, $Q_3$, $Q_5$, $Q_6$ and $Q_a$, respectively, of the FIG. 3 embodiment. Similarly, the resistors $R_{11}$, $R_{12}$, $R_{13}$, $R_{14}$, $R_{15}$, $R_{16}$ and $R_{17}$ of the FIG. 11 embodiment are equivalent in function to the resistors $R_1$, $R_a$, $R_3$, $R_4$, $R_f$, $R_b$, $R_c$ and $R_d$, respectively, of the FIG. 3 embodiment. Consequently, the biasing circuit 7f functions to make negative feedback control of the current through the amplifying transistor $Q_{11}$ and hence to protect the same from thermal breakdown.

Notwithstanding the foregoing detailed disclosure, it is not desired that the present invention be limited by the exact showing of the drawings or the description thereof. The following, then, is a brief list of possible modifications or alterations of the illustrated embodiments which are all considered to fall within the scope of the invention:

1. The FIGS. 4–6, and 8–10 embodiments could all be adapted for use with two signal sources $e_1$ and $e_2$ as in FIG. 7 embodiment.

2. The fourth biasing circuit 8 of the FIGS. 4–7, 9 and 10 embodiments could be replaced by its FIG. 8 counterpart 8a.

3. The resistor $R_f$ of the FIGS. 4–9 embodiments could be connected as in the FIG. 10 embodiment.

4. The amplifying transistors $Q_1$ and $Q_2$ of the FIGS. 4–8 and 10 embodiments, as well as the amplifying transistor $Q_{11}$ of the FIG. 11 embodiment, could all be replaced by field-effect transistors as in the FIG. 9 embodiment.

5. The unitary power supply system of FIG. 10 could be applied to all of the FIGS. 4–9 embodiments.

6. Various other known methods of signal inputting could be employed.

7. As indicated by the broken lines designated 20 in FIGS. 3, 4 and 7–10, the bias transistor $Q_5$ could have its base connected to the emitter, or source, of the first amplifying transistor $Q_1$ or $Q_{1a}$, instead of to the emitter of the first drive transistor $Q_3$. Similarly, as indicated by the broken lines 20 in FIGS. 5 and 6, the transistor $Q_5$ could have its base connected to the emitter of the second amplifying transistor $Q_2$, instead of to the emitter of the second drive transistor $Q_4$. In these cases the drive transistors $Q_3$ and $Q_4$ might be omitted, with the bases of the final-stage transistors connected to the biasing circuit 5 or 5a.

8. In the FIG. 11 embodiment, too, the transistor $Q_{13}$ of the biasing circuit 7f could have its base connected to the emitter of the amplifying transistor $Q_{11}$ as indicated by the broken line 20, instead of to the emitter of the drive transistor $Q_{12}$. In this case the drive transistor $Q_{12}$ might be omitted, with the base of the final-stage transistor connected to the biasing circuit 5b.

9. The FIG. 5 biasing circuit 7d could be employed in the FIGS. 7–10 embodiments.

10. As indicated by the broken lines in FIGS. 7–11, a diode D could be connected in series with the resistor $R_3$ or $R_{13}$.

11. Darlington connections of three or more transistors could be used for current amplification in the embodiment disclosed above, with the emitter of each preselected amplifier connected to the base of the bias transistor $Q_5$ or $Q_{13}$.

What is claimed is:

1. A single-ended push-pull amplifier circuit suitable for power amplification of audio signals, among other applications, the amplifier circuit comprising:

(a) a first and a second supply terminal;

(b) an output terminal to be connected to a load;

(c) first current control means connected between the first supply terminal and the output terminal for controlling current flow therebetween, the first current control means having a control terminal;

(d) second current control means connected between the second supply terminal and the output terminal for controlling current flow therebetween, the second current control means having a control terminal;

(e) a serial connection of a first and a second resistor, the second resistor being connected to the control terminal of either of the first and the second current control means;

(f) a first bias transistor connected between the control terminal of the other of the first and the second current control means and the first resistor, the first bias transistor having a control terminal connected to said other of the first and the second current control means; and (g) a second bias transistor connected between the control terminals of the first and the second current control means, the second bias transistor having a control terminal connected to a junction between the first and the second resistor.

2. The amplifier circuit of claim 1 further comprising a diode connected between the first resistor and the first bias transistor.

3. The amplifier circuit of claim 1 wherein the first and the second supply terminal are for providing voltages that are opposite in polarity and equal in absolute value.

4. The amplifier circuit of claim 1 wherein one of the first and the second supply terminal is grounded, wherein the amplifier circuit further comprises a coupling capacitor connected to the output terminal, and wherein the load is to be connected between the grounded supply terminal and the coupling capacitor.

5. The amplifier circuit of claim 1 wherein the first current control means comprises:

(a) a first current control element having a first main terminal connected to the first supply terminal, a second main terminal connected to the output terminal, and a control terminal; and (b) a first drive transistor having a collector connected to the first supply terminal, a emitter connected to the control terminal of the first current control element, and a base as the control terminal of the first current control means; and wherein the second current control means comprises:

(a) a second current control element having a first main terminal connected to the second supply terminal, a second main terminal connected to the output terminal, and a control terminal; and (b) a second drive transistor having a collector connected to the second supply terminal, a emitter connected to the control terminal of the second current control element, and a base as the control terminal of the second current control means.

6. The amplifier circuit of claim 5 wherein the second resistor is connected to the base of the second drive transistor, the collector of the first bias transistor is connected to the base of the first drive transistor, the emitter of the first bias transistor is connected to the first resistor, and the base of the first bias transistor is connected to the emitter of the first drive transistor.

7. The amplifier circuit of claim 5 wherein the second resistor is connected to the base of the second drive transistor, the collector of the first bias transistor is connected to the base of the first drive transistor, the emitter of the first bias transistor is connected to the first resistor, and the base of the first bias transistor is connected to the second main terminal of the first current control element.

8. The amplifier circuit of claim 5 wherein the second resistor is connected to the base of the first drive transistor, the collector of the first bias transistor is connected to the base of the second drive transistor, the emitter of the first bias transistor is connected to the first resistor, and the base of the first bias transistor is connected the emitter of the second drive transistor.

9. The amplifier circuit of claim 5 wherein the second resistor is connected to the base of the first drive transistor, the collector of the first bias transistor is connected to the base of the second drive transistor, the emitter of the first bias transistor is connected to the first resistor, and the base of the first bias transistor is connected to the second main terminal of second current control element.

10. The amplifier circuit of claim 1 further comprising:

(a) a third resistor connected between the first current control means and the output terminal; and (b) a fourth resistor connected between the second current control means and the output terminal.

* * * * *